(12) United States Patent
Tan et al.

(10) Patent No.: US 9,268,107 B2
(45) Date of Patent: Feb. 23, 2016

(54) OPTICAL WAVEGUIDE

(75) Inventors: Michael Renne Ty Tan, Menlo Park, CA (US); Sagi Varghese Mathai, Sunnyvale, CA (US); Wayne Victor Sorin, Mountain View, CA (US); Arlen L Roesner, Ft. Collins, CO (US); Glenn C. Simon, Auburn, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/417,819

(22) PCT Filed: Jul. 30, 2012

(86) PCT No.: PCT/US2012/048825
§ 371 (c)(1),
(2), (4) Date: Jan. 28, 2015

(87) PCT Pub. No.: WO2014/021818
PCT Pub. Date: Feb. 6, 2014

(65) Prior Publication Data
US 2015/0205061 A1    Jul. 23, 2015

(51) Int. Cl.
*G02B 6/26* (2006.01)
*G02B 6/38* (2006.01)
(Continued)

(52) U.S. Cl.
CPC ............ *G02B 6/4259* (2013.01); *G02B 6/1221* (2013.01); *G02B 6/3807* (2013.01);
(Continued)

(58) Field of Classification Search
CPC .. G02B 6/4259; G02B 6/3807; G02B 6/4214; G02B 6/423; G02B 6/4249; G02B 6/4269; G02B 6/43

USPC .................................................... 385/33, 60
See application file for complete search history.

(56) References Cited

U.S. PATENT DOCUMENTS 4,460,424 A  *  7/1984  Buser et al. ................... 156/242
6,709,607 B2    3/2004  Hibbs-Brenner et al.
(Continued)

FOREIGN PATENT DOCUMENTS

JP    2008158001 A       7/2008
JP    2008158001 A  *    7/2008  ...................... 385/49
(Continued)

OTHER PUBLICATIONS

International Search Report and Written Opinion, Mar. 28, 2013, PCT Patent Application No. PCT/US2012/048825, 12 pages.
(Continued)

*Primary Examiner* — Jerry Blevins
(74) *Attorney, Agent, or Firm* — Tarolli, Sundheim, Covell & Tummino L.L.P.

(57) ABSTRACT

One example relates to an optical engine comprising an optical waveguide. The optical waveguide can comprise a total internal reflection (TIR) edge to change direction of an optical light beam to an angle parallel to a top surface and a bottom surface of the optical waveguide. The optical waveguide can also comprise a plurality of aligning holes extending from the top surface to the bottom surface of the optical waveguide. The optical engine can comprise a substantially transparent slab underlying the optical waveguide. The slab can also comprise a micro lens to collimate the optical light beam. The slab can further comprise a plurality of aligning pins extending perpendicular from a top surface and bottom surface of the slab. Each of the plurality of aligning pins can extend through a respective one of the plurality of aligning holes.

20 Claims, 15 Drawing Sheets

(51) Int. Cl.
*G02B 6/42* (2006.01)
*G02B 6/122* (2006.01)
*G02B 6/43* (2006.01)

(52) U.S. Cl.
CPC ............ *G02B 6/423* (2013.01); *G02B 6/4214* (2013.01); *G02B 6/4249* (2013.01); *G02B 6/4269* (2013.01); *G02B 6/43* (2013.01); *G02B 6/3885* (2013.01)

(56) References Cited

U.S. PATENT DOCUMENTS

| | | | |
|---|---|---|---|
| 6,754,406 | B2 | 6/2004 | Kaneshiro et al. |
| 6,845,184 | B1 | 1/2005 | Yoshimura et al. |
| 2005/0141823 | A1 | 6/2005 | Han et al. |
| 2008/0226222 | A1* | 9/2008 | Kim et al. ................... 385/14 |
| 2010/0215314 | A1 | 8/2010 | Lau et al. |

FOREIGN PATENT DOCUMENTS

| | | |
|---|---|---|
| JP | 2008209514 A | 9/2008 |
| KR | 1020080084660 A | 9/2008 |
| KR | 1020080088723 A | 10/2008 |

OTHER PUBLICATIONS

Libsch, F.R. et al., MCM LGA Package with Optical I/O Passively Aligned to Dual Layer Polymer Waveguides in PCB, (Research Paper), Electronic Components and Technology Conference, 2006, pp. 1693-1699.

Papakonstantinou, I. et al., Low-cost, Precision, Self-alignment Technique for Coupling Laser and Photodiode Arrays to Polymer Waveguide Arrays on Multilayer PCBs, (Research Paper), Aug. 2008, IEEE Transactions on Advanced Packaging, pp. 502-511, vol. 31, No. 3.

* cited by examiner

OPTICAL WAVEGUIDE

BACKGROUND

In optics, an optical waveguide is a physical structure that guides electromagnetic waves in the optical spectrum. Common types of optical waveguides include optical fiber and rectangular waveguides. Optical waveguides can be employed as components in integrated optical circuits or as a transmission medium in local and long haul optical communication systems.

In electronic systems, a heat sink is a passive component that cools a device by dissipating heat into the surrounding air. Heat sinks can be employed to cool electronic components such as high-power semiconductor devices, and optoelectronic devices such as higher-power lasers and light emitting diodes (LEDs).

Flip chip, also known as controlled collapse chip connection or its acronym, C4, is a method for interconnecting semiconductor devices, such as IC chips, to external circuitry with solder bumps that have been deposited onto chip pads. The solder bumps can be deposited on the chip pads on a top side of a wafer during a final wafer processing step. In order to mount the IC chip to external circuitry (e.g., a circuit board), the IC chip is flipped over so that the IC chip's top side faces down, and aligned so that the IC chip's pads align with matching pads on the external circuit, and then the solder is flowed to complete the interconnect.

DETAILED DESCRIPTION

An optical engine can include an optical waveguide with an angled total internal reflection (TIR) edge that can change the direction of an optical light beam and cause the optical light beam to enter the optical waveguide, similar to a prism. The TIR edge of the optical waveguide can overlay a micro lens on a glass slab to receive an optical light beam transmitted by an optical transmitter. In this manner, the TIR edge of the optical waveguide can change direction of the optical light beam for propagation along the optical waveguide and toward an optical connector. Employment of the optical engine provides an efficient, low profile and cost effective system for transmitting optical light beams, particularly for optical communications between computer servers mounted on a rack and/or components mounted on a printed circuit board. Moreover, the optical engine can support a relatively large amount of bandwidth (e.g., broadband communications), such as about 2 terabits per second (Tbps). Further, the optical engine can avoid the employment of relatively expensive components such as optical ferrules to provide optical communication.

Figure 1:
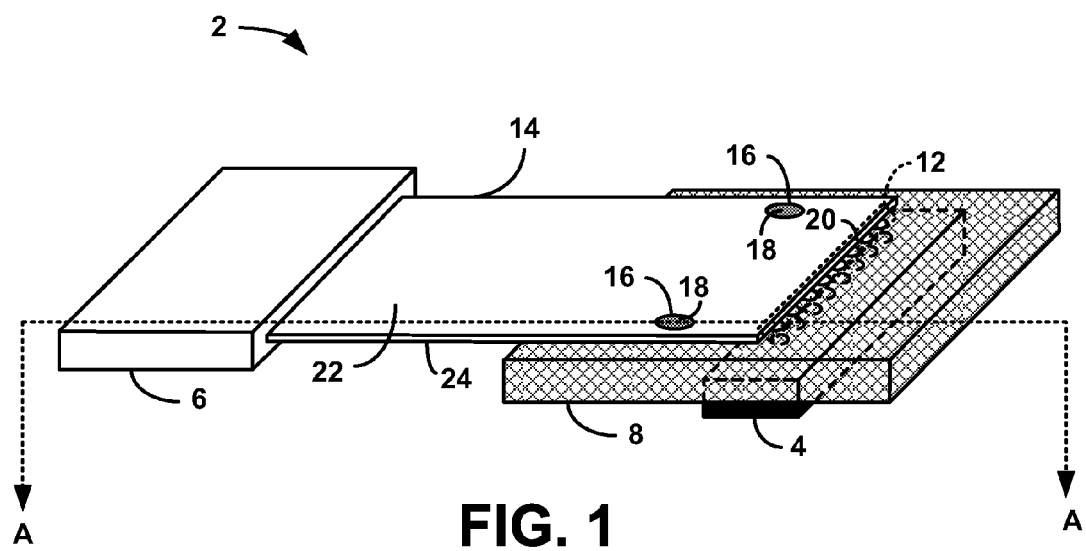
FIG. 1 illustrates an example of an optical engine.
Figure 2:
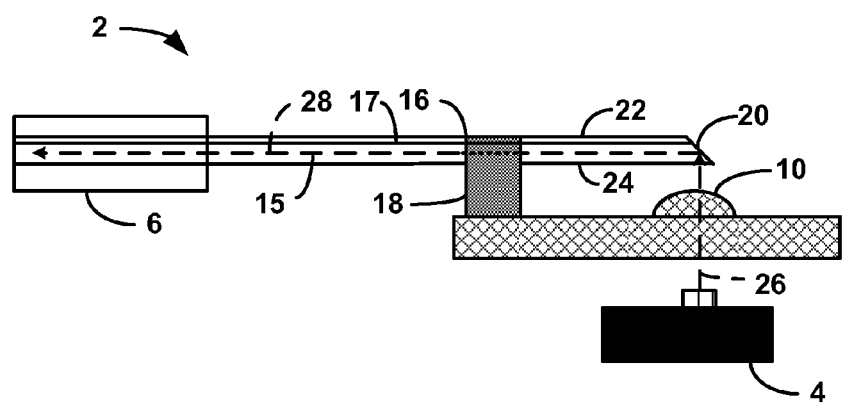
FIG. 2 illustrates a cross sectional view of an optical engine that could be employed to implement the optical engine illustrated in FIG. 1.

FIG. 1 illustrates an example of an optical engine 2 to transport an optical light beam carrying communication signals. FIG. 2 illustrates a cross-sectional view of the optical engine 2 taken along line A-A of FIG. 1. For purposes of simplification of explanation, the same reference numbers are employed in FIGS. 1 and 2 to denote the same structure. In the present example illustrated in FIGS. 1 and 2, an optical transmitter 4 (e.g., a laser) is to provide the optical light beam to an optical connector 6, such that the optical engine 2 can be employed to provide optical communications by sourcing the light beam. In other examples, the optical transmitter 4 can be replaced with an optical receiver (e.g., a photodetector, such as a photodiode), such that the optical engine 2 can be employed to receive optical communications in the light beam.

The optical transmitter 4 can be implemented, for example, as a laser array, such as a diode laser array. In such a situation, the optical transmitter 4 can transmit N number of independently controllable optical communication signals, wherein N is an integer greater than or equal to one. The optical transmitter 4 can be implemented, for example, as an integrated circuit (IC) chip that can be adhered to a glass slab 8. In one example, the optical transmitter 4 can be adhered to the glass slab 8 by employing flip chip techniques. In one example, the optical transmitter 4 can be implemented an array of Vertical-cavity surface-emitting lasers (VCSELs). In some examples, the optical communication signal can be a single-mode optical communication signal, while in other examples; the optical communication signal can be a multi-mode optical communication signal.

The optical transmitter 4 can transmit the optical communication signal through the glass slab 8 and through a micro lens 10 of a micro lens array 12. There can be N number of micro lenses 10 in the micro lens array 12. Each micro lens 10 can be implemented, for example, as a convex lens that can collimate an optical light beam corresponding to the optical communication signal and transmit the optical light beam toward an optical waveguide 14. The optical waveguide 14 can be implemented, for example, as a polymer optical waveguide 15. The polymer optical waveguide 15 can be adhered to a stiffener 17, such as a plastic material, a metal sheet, a glass substrate, etc. Adherence of the polymer optical waveguide 15 to the stiffener 17 can cause the optical waveguide 14 to be relatively rigid. The optical waveguide 14 can include N number of parallel optical lanes to propagate N number of concurrent optical communication signals.

The optical waveguide 14 can include alignment holes 16 to receive alignment pins 18 mounted on the glass slab 8. Upon insertion of the alignment pins 18 into the alignment holes 16, the position of the optical waveguide 14 can be set relative to a position of the micro lens array 12. In some examples, the alignment holes 16 can be several micrometers larger than the alignment pins 18.

An end face of the optical waveguide 14 can be angled relative to a top or bottom surface of the optical waveguide 14 and such an end face can be referred to as a TIR edge 20. The angle of the TIR edge 20 can be referred to as a bend angle. The bend angle can change direction of the optical light beam such that the optical light beam is propagated along the optical waveguide 14. For instance, in some examples, the bend angle can be about 45°, such that if the optical light beam is transmitted in a direction perpendicular to a top surface 22 and a bottom surface 24 of the optical waveguide 14, the optical light beam can be bent by about 90°. The arrow 26 illustrates an example of an optical light beam propagated in a substantially vertical direction, which direction is substantially perpendicular to the top and bottom surfaces 22 and 24 of the optical waveguide 14. Moreover, arrow 28 illustrates an example of an optical light beam being propagated in a direction that is bent by about 90° by the TIR edge 20. The TIR edge 20 is illustrated as being implemented with a substantially flat surface. However, in other examples, the TIR edge 20 can have a different shape, such as a convex surface. The optical communication signal can be provided to the optical connector 6. The optical connector 6 can be for example, a male or female optical connector that can be connected to a female or male optical connector, respectively.

Employment of the optical engine 2 provides for a low-profile, efficient, high bandwidth optical communication system. The optical engine 2 can be employed to provide N number of parallel optical lanes through the optical waveguide 14, such that the bandwidth can be up to about 2 terabits per second (Tbps). Moreover, the optical engine 2 can be relatively inexpensive to assemble and maintain, since the optical waveguide 14 can be affixed to the glass slab 8 mechanically (e.g., via mechanical fasteners) without the need for active-alignment of the light beams and subsequent use of soldering and/or epoxy. Further, the optical engine 2 can be fabricated by the employment of relatively simple solder reflow techniques, which can include flip chip techniques.

FIGS. 3-16 illustrate various views of an example optical engine 100 and associated components that could be employed, for example, to implement the optical engine 2 illustrated in FIG. 1. For purposes of simplification of explanation, the same reference numbers are employed in FIGS. 3-16 to denote the same structure.

Figure 3:
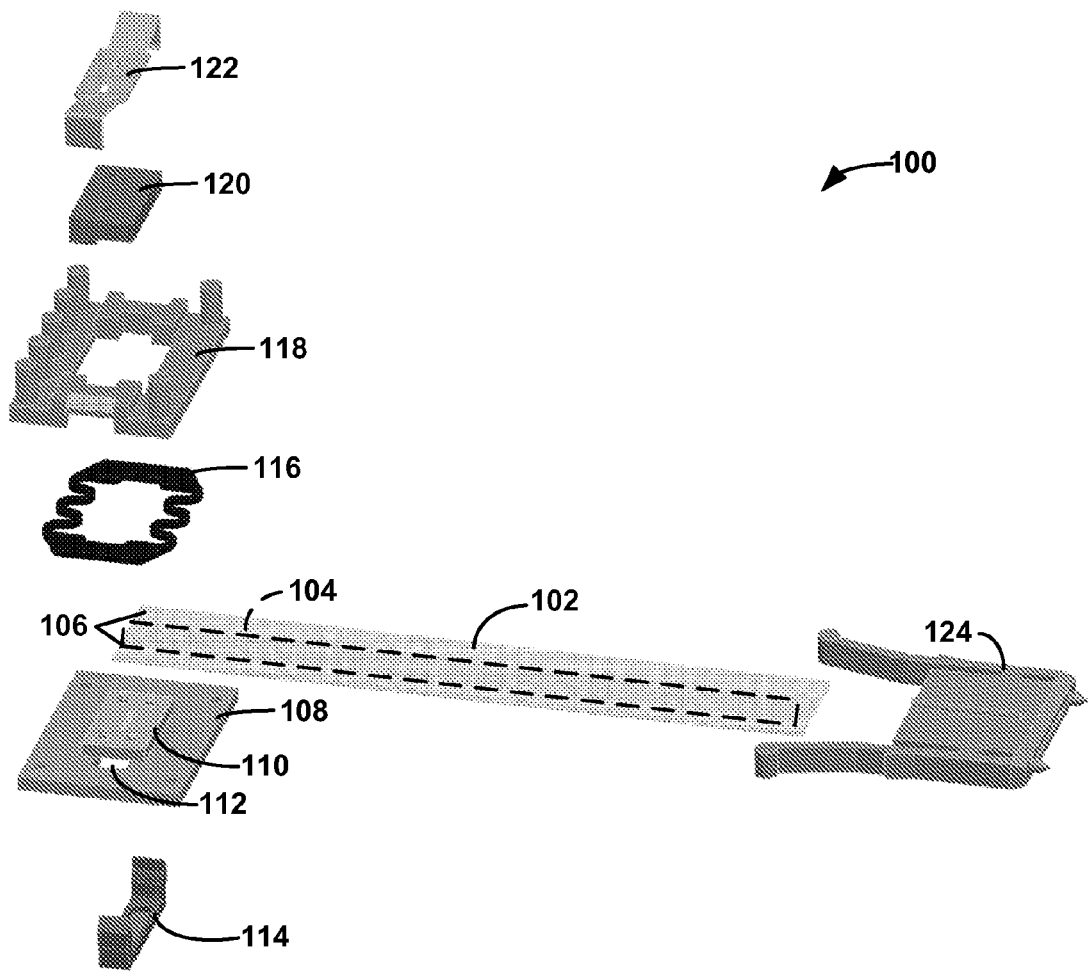
FIG. 3 illustrates an exploded view of components that could be employed to implement the optical engine illustrated in FIG. 1.

FIG. 3 illustrates an exploded view of components of the optical engine 100 that can be employed, for example, to implement the optical engine 2 illustrated in FIG. 1. The optical engine 100 can include an optical waveguide 102 that can include a polymer optical waveguide that can be laminated with a stiffener. The stiffener can provide rigidity to the optical waveguide. The optical waveguide 102 can be a multi-lane optical waveguide with N number of optical lanes 104 for propagating N number of optical communication signals concurrently, wherein each optical communication signal can correspond to one of N number of optical light beams. The optical waveguide 102 can include alignment holes 106 for receiving corresponding alignment pins.

The optical engine 100 can include an optical transmitter mounted to a substrate, such as a printed circuit board (PCB) 108 (e.g., an organic PCB) and a glass slab 110. The glass slab 110 can overlay the optical transmitter. Moreover, the PCB 108 can include an elongated aperture 112 sized to accommodate the optical transmitter, and to receive a heat spreader 114. A heat spreader clip 116 can overlay the PCB 108. Moreover, the heat sink 118 can overlay the heat spreader clip 116. A spacer 120 can be affixed to the heat sink 118 to accommodate a clip 122. The optical waveguide 102 can be fastened to a male optical connector 124.

Figure 4:
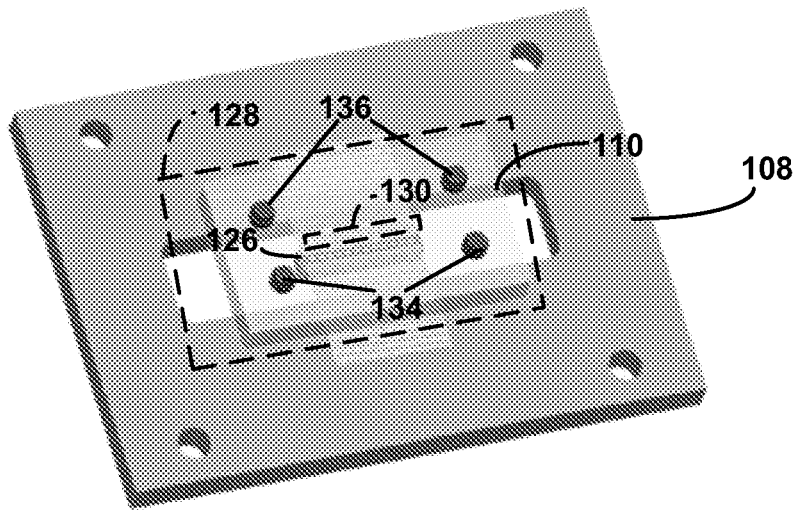
FIG. 4 illustrates a top view of an optical transmitter mounted on a PCB and a glass slab overlying the optical transmitter that could be employed to implement the optical engine illustrated in FIG. 1.
Figure 5:
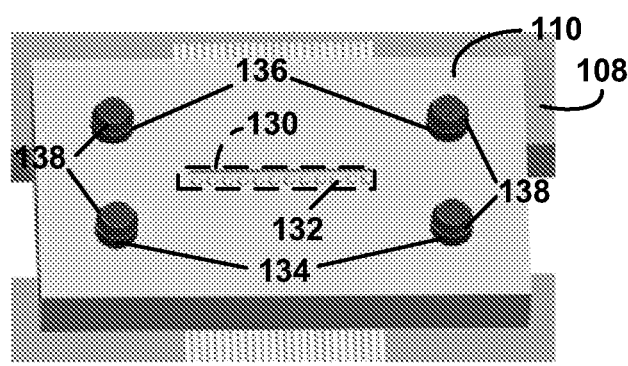
FIG. 5 illustrates an expanded view of the optical transmitter mounted on the PCB and the glass slab overlying the optical transmitter illustrated in FIG. 4.

FIG. 4 illustrates a top view of the optical transmitter 126 mounted on the glass slab 110 overlying the optical transmitter 126 and mounted on the PCB 108. FIG. 5 illustrates an expanded view of the glass slab 110 taken along line 128 of FIG. 4. For purposes of simplification of explanation, the glass slab 110 in FIG. 5 is illustrated as being opaque, but it is to be understood that the glass slab 110 can be substantially transparent or translucent to allow for the transmission of an optical light beam.

The glass slab 110 can include a micro lens array 130 that can include N number of micro lenses 132 that each can receive N number of optical light beams from the optical transmitter 126. Each micro lens 132 of the micro lens array 130 can collimate a respective optical light beam for transmission through the optical waveguide 102.

The glass slab 110 can include two different sets of alignment pins, namely, a first set of alignment pins 134 and the second set of alignment pins 136. The first set of alignment pins 134 can be positioned to align the optical waveguide 102 relative to the optical transmitter 126. The second set of alignment pins 136 can be positioned to align the spacer 120 and the clip 122. Each aligning pin of the first and second sets of alignment pins 134 and 136 can include a tapered region 138 to facilitate the insertion of the respective alignment pin into a corresponding alignment hole 106 of the optical waveguide 102 or the spacer 120.

Figure 6:
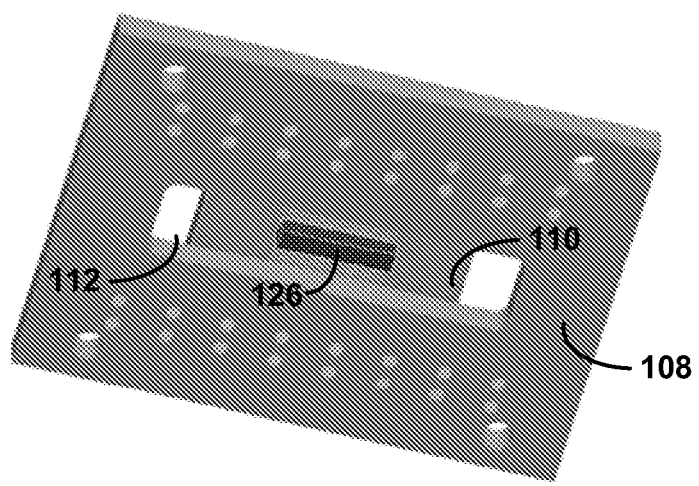
FIG. 6 illustrates a bottom view of the optical transmitter mounted on the PCB and the glass slab overlying the optical transmitter illustrated in FIG. 4.

FIG. 6 illustrates a bottom view of the optical transmitter 126 mounted on the glass slab 110. The optical transmitter 126 can be implemented, for example, as an IC chip, such as a diode laser. In some examples, the optical transmitter 126 can be adhered to the glass slab 110 through the employment of flip chip techniques. For instance, the optical transmitter 126 can be solder reflowed to the glass slab 110. After the solder reflow, an edge seal material (epoxy) can applied on a perimeter of the optical transmitter 126. In such a situation, the edge seal material can flow between the optical transmitter 126 and the glass slab 110 as well as around solder bumps formed from the solder reflow. However, employment of the flip chip techniques can keep the interior of the optical transmitter 126 relatively free of the edge seal material. Moreover, the optical transmitter 126 can be adhered to the PCB 108 via a plurality of solder points. In a similar manner, the glass slab 110 can be adhered to the PCB 108 through another plurality of solder points. The PCB 108 can include the elongated aperture 112 that can be sized to accommodate the optical transmitter 126. In this manner, in some examples, the optical transmitter 126 does not extend through the PCB 108. The elongated aperture 112 can also be sized to accommodate the heat spreader 114 in a manner described herein.

Figure 7:
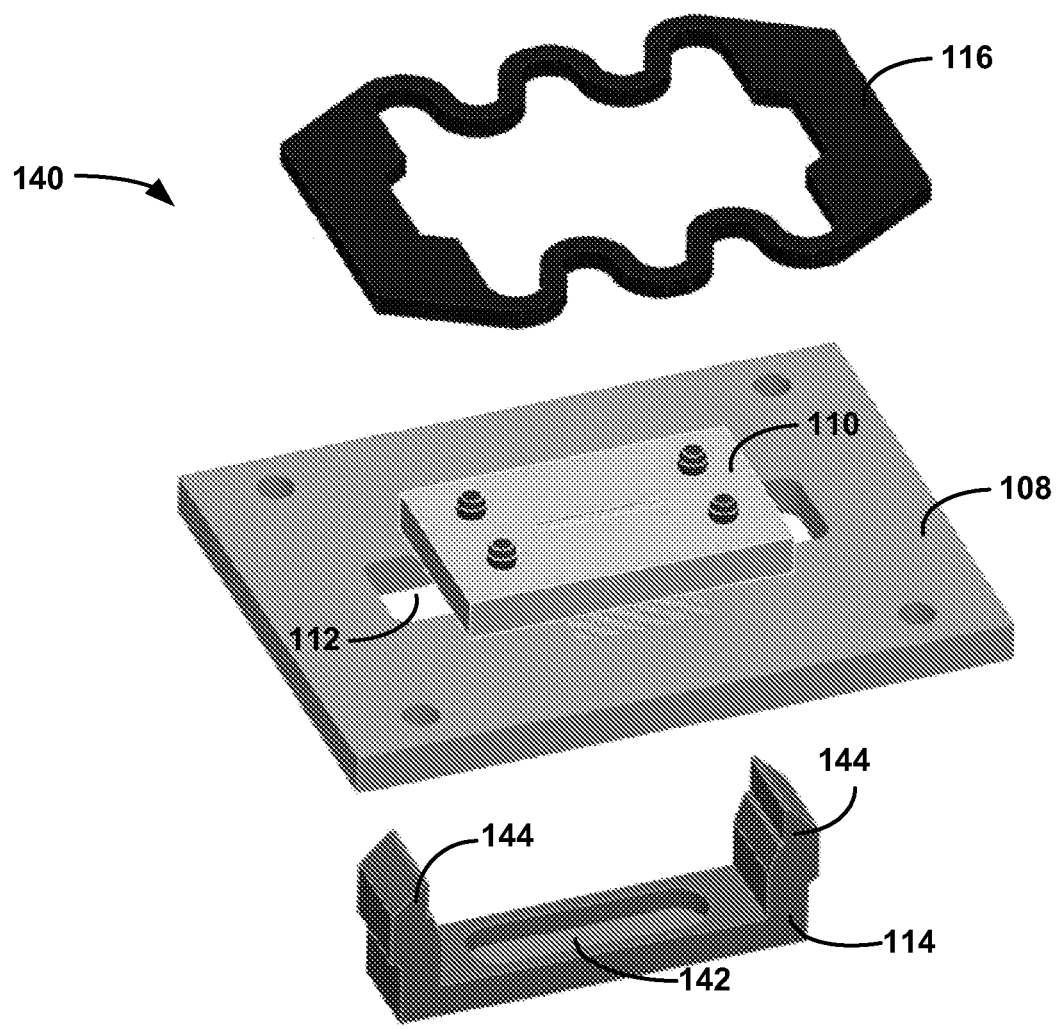
FIG. 7 illustrates an exploded view of an example of a submodule that could be employed to implement the optical engine illustrated in FIG. 1.
Figure 8:
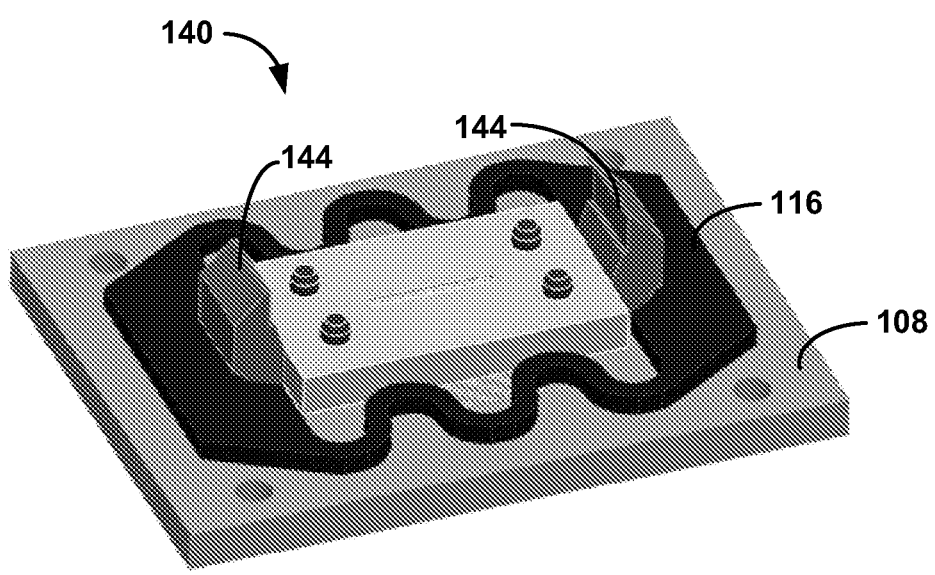
FIG. 8 illustrates the submodule of the optical engine illustrated in FIG. 7 in an assembled condition.

FIGS. 7 and 8 illustrate an example of an assembly of a submodule 140 of the optical engine 100. As illustrated in FIGS. 7-8, the elongated aperture 112 of the PCB 108 can receive a heat spreader 114 on the bottom of the PCB 108. The heat spreader 114 can include an elongated groove 142 to receive the optical transmitter 126. Moreover, the heat spreader 114 can include opposing clips 144 that can be inserted into opposing ends of the elongated aperture 112 of the PCB 108. In some examples, opposing clips 144 of the heat spreader 114 can be depressed towards each other, such that the opposing clips 144 can be inserted through the elongated aperture 112 of the PCB 108. In some examples, the heat spreader 114 can be formed of a thermally conductive material, such as copper. Additionally, the heat spreader clip 116 can circumscribe the glass slab 110 and the opposing clips 144 of the heat spreader 114. Moreover, the heat spreader clip 116 can overlay the PCB 108. The heat spreader clip 116 can be formed, for example, from plastic. In some examples, the heat spreader clip 116 can have a shape as illustrated in FIG. 7, while in other examples other shapes could be employed. Upon release of the opposing clips 144 of the heat spreader 114, the opposing clips 144 of the heat spreader 114 can securely fasten the heat spreader clip 116 and the heat spreader 114 in place.

Figure 9:
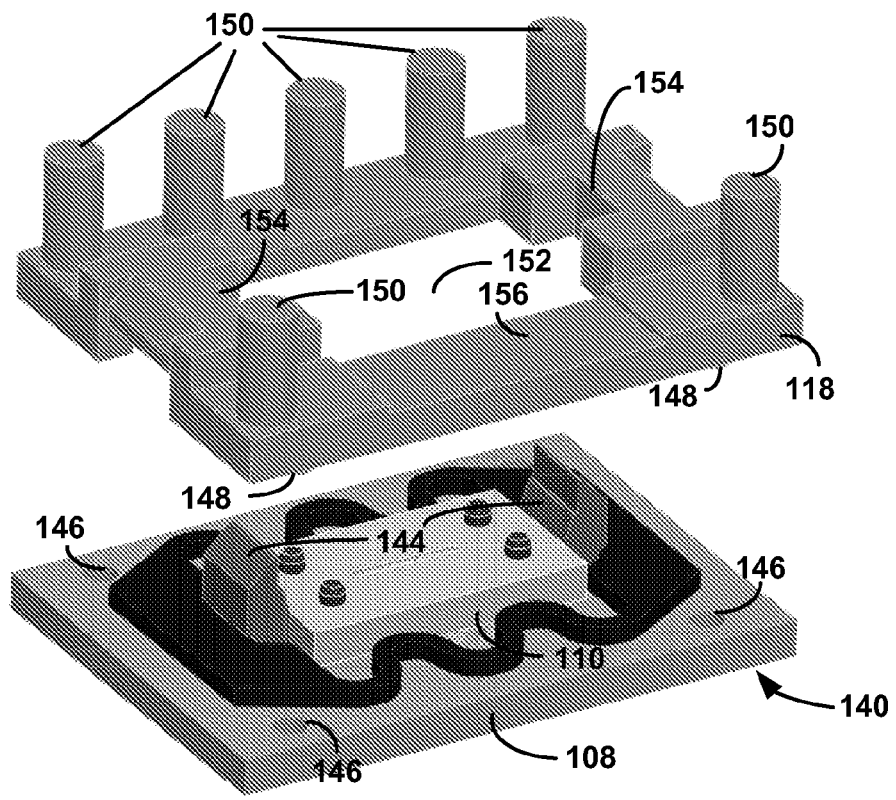
FIGS. 9-10 illustrate a placement of a heat sink on the submodule illustrated in FIG. 8.
Figure 10:
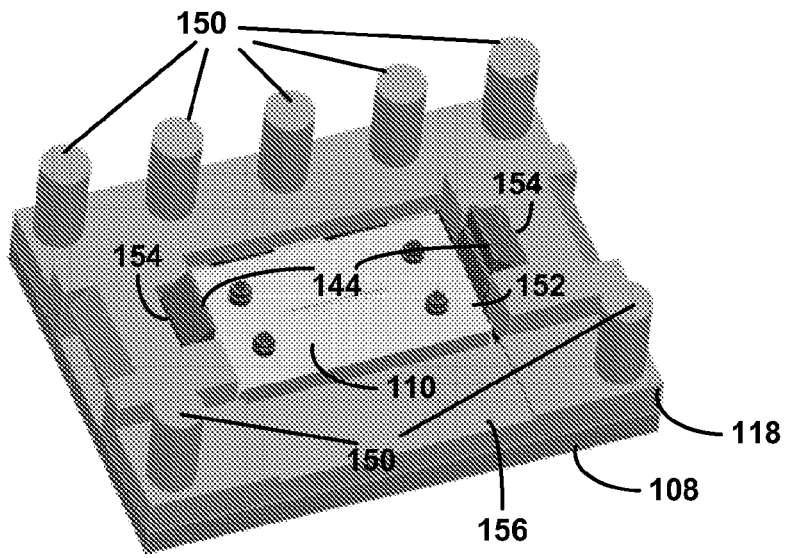

FIGS. 9 and 10 illustrate a heat sink 118 being affixed to the subassembly module. The PCB 108 can include aligning holes 146 that can receive aligning pins 148 of the heat sink 118. The heat sink 118 can be fabricated, for example, with a metal that can conduct heat, such as copper. The heat sink 118 can include heat distribution elements 150 (e.g., posts) that can draw heat away from the PCB 108 and the optical transmitter 126. In some examples, the heat distribution elements 150 can be referred to as pin-fins. As illustrated in FIGS. 9 and 10, the heat sink 118 can include an elongated aperture 152 to receive the glass slab 110 and the opposing clips 144 of the heat spreader 114. In some examples, the heat sink 118 can include grooves 154 to receive the opposing clips 144 of the heat spreader 114 and to position the heat sink 118 relative to the submodule 140. In some examples, a conductive epoxy can be applied between the heat spreader 114 and the heat sink 118 to facilitate thermal conduction of heat from the optical transmitter 126 to the heat distribution posts. The heat sink 118 can further include an optical waveguide groove 156 that can be sized to receive the optical waveguide 102.

Figure 11:
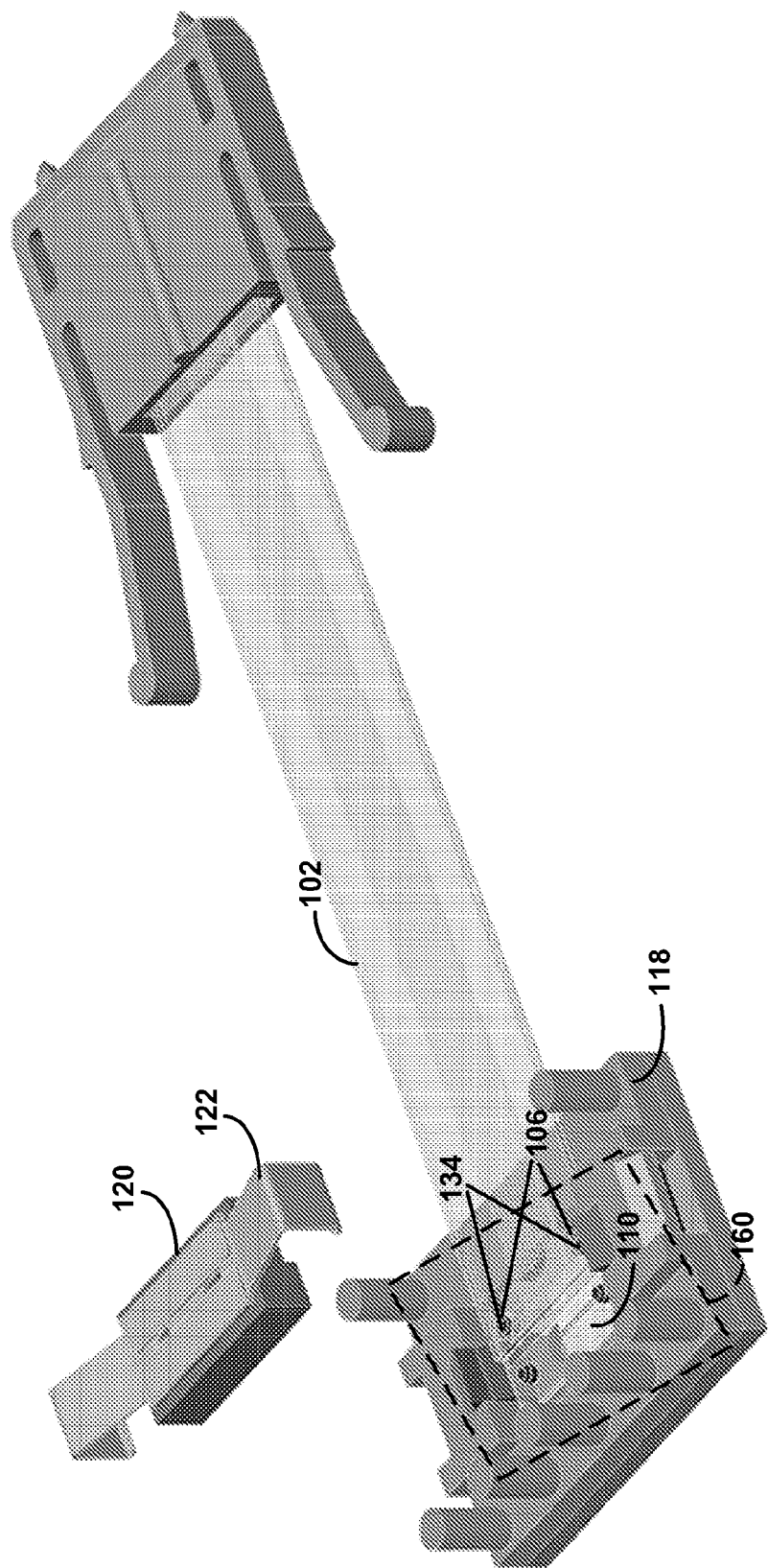
FIG. 11 illustrates an example of an optical waveguide coupled to the submodule and the heat sink illustrated in FIG. 10.
Figure 12:
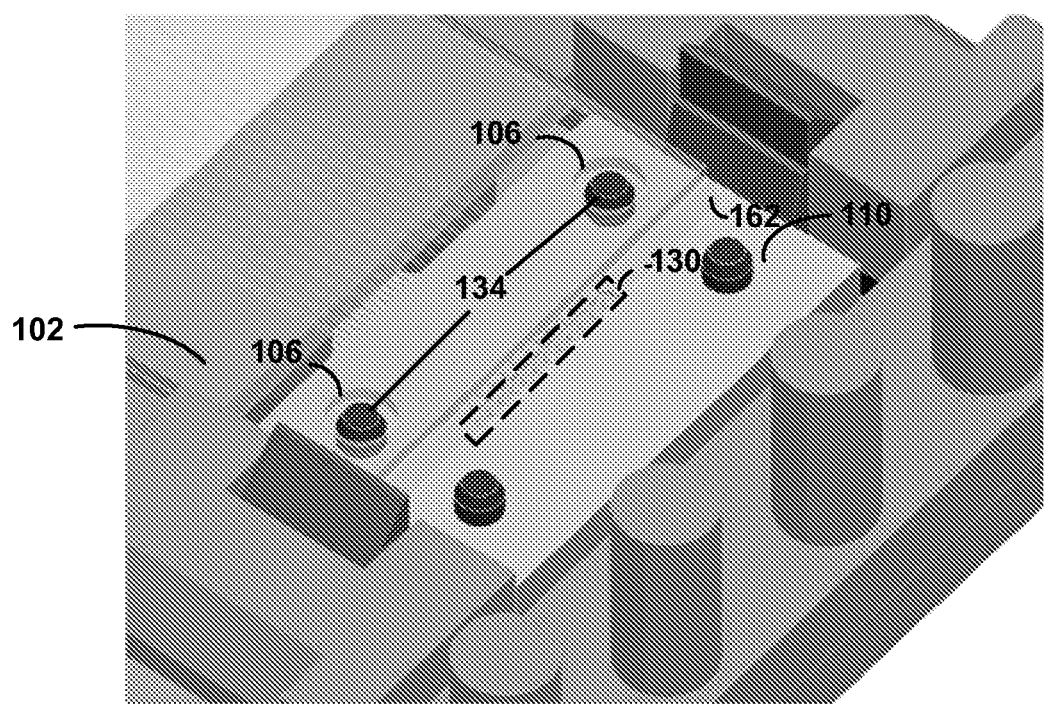
FIG. 12 illustrates an expanded view of the optical waveguide coupled to the submodule and the heat sink illustrated in FIG. 11.

FIG. 11 illustrates the optical waveguide 102 inserted into the optical waveguide groove 156 of the heat sink 118 and the clip 122 with the spacer 120 overlaying the heat sink 118. FIG. 12 illustrates an expanded view of the optical waveguide 102 inserted into the optical waveguide groove 156 of the heat sink 118 taken from line 160 of FIG. 11. The optical waveguide 102 can be positioned such that the alignment holes 106 of the optical waveguide 102 receive the first set of alignment pins 134 that are mounted on the glass slab 110. The optical waveguide groove 156 of the heat sink 118 can have a width about equal to a width of the optical waveguide 102. The optical waveguide groove 156 of the heat sink 118 can have a depth such that a height of the heat sink 118 in the optical waveguide groove 156 substantially matches a height of the glass slab 110, such that the optical waveguide 102 can extend from the glass slab 110 to the male optical connector 124 without interruption.

As illustrated in FIG. 12, a TIR edge 162 of the optical waveguide 102 can overly the micro lens array 130 of the glass slab 110. The TIR edge 162 can be, for example, a face of the optical waveguide 102 cut and/or formed at about a 45° angle (or some other angle) relative to a top or bottom surface of the optical waveguide 102.

Figure 13:
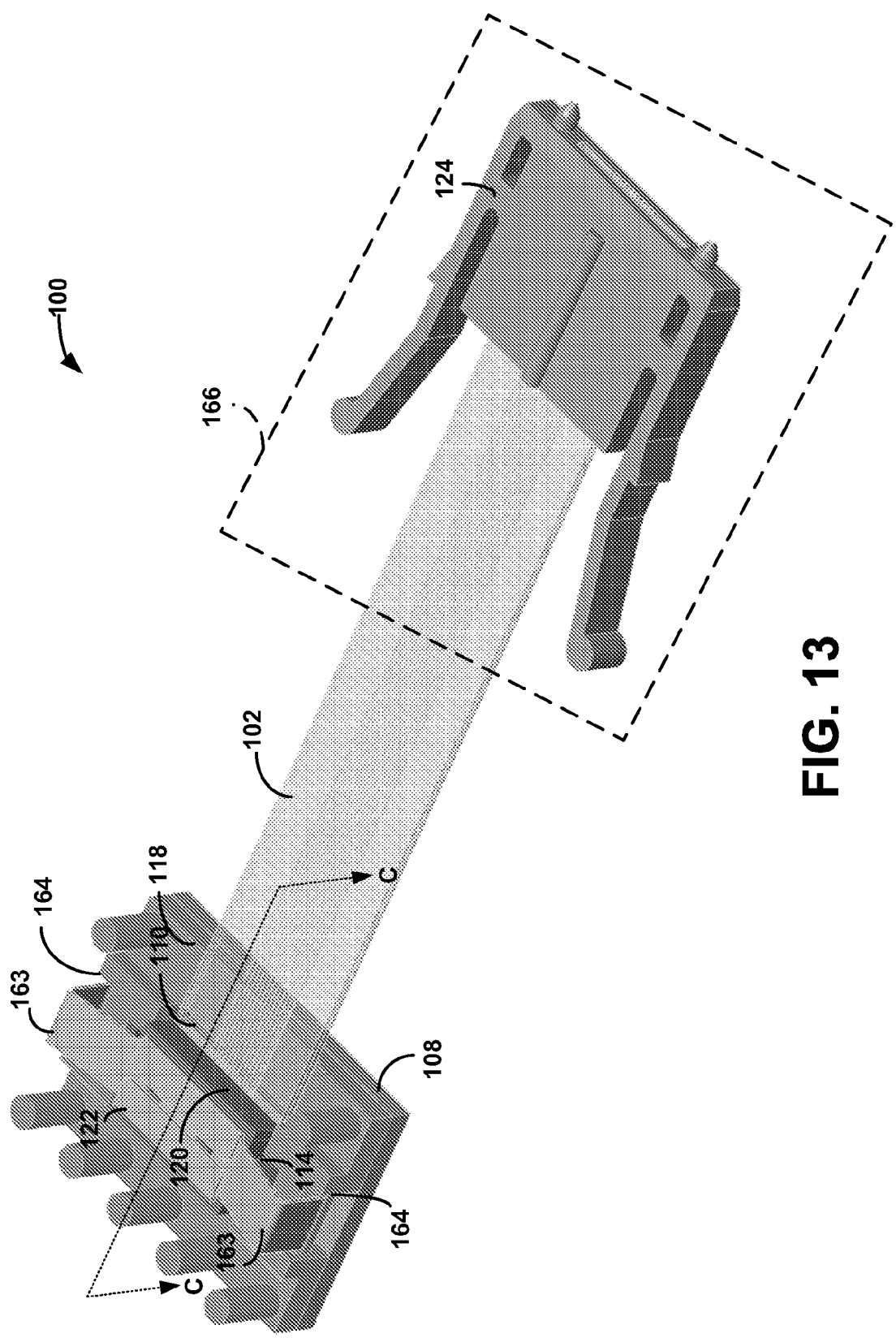
FIG. 13 illustrates an example of components of an optical engine illustrated in FIG. 2 in an assembled condition.

FIG. 13 illustrates the optical engine 100 in a fully assembled condition. In the fully assembled condition, the spacer 120 can be inserted such that aligning holes of the spacer 120 receive the second set of alignment pins 136 of the glass slab 110. The spacer 120 can be formed, for example, from plastic. Moreover, a clip 122 can overlay the spacer 120. The clip 122 can include arm elements 163 that extend from a center of the clip 122. The arm elements 163 of the clip 122 can be received in corresponding grooves 164 of the heat sink 118 to mechanically fasten the spacer 120 and the clip 122 to the heat sink 118.

Figure 14:
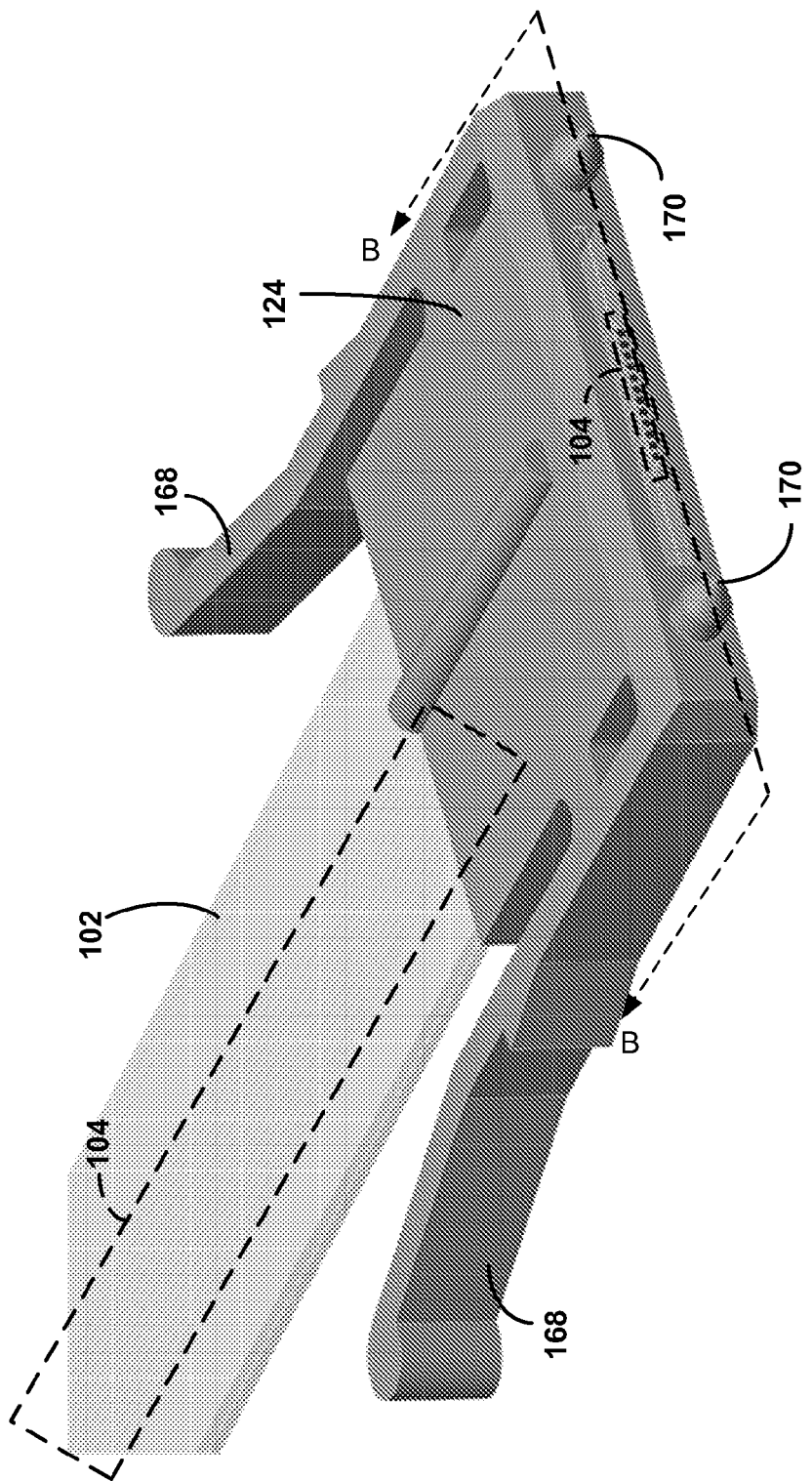
FIG. 14 illustrates an expanded view of a male optical connector illustrated in FIG. 13.
Figure 15:
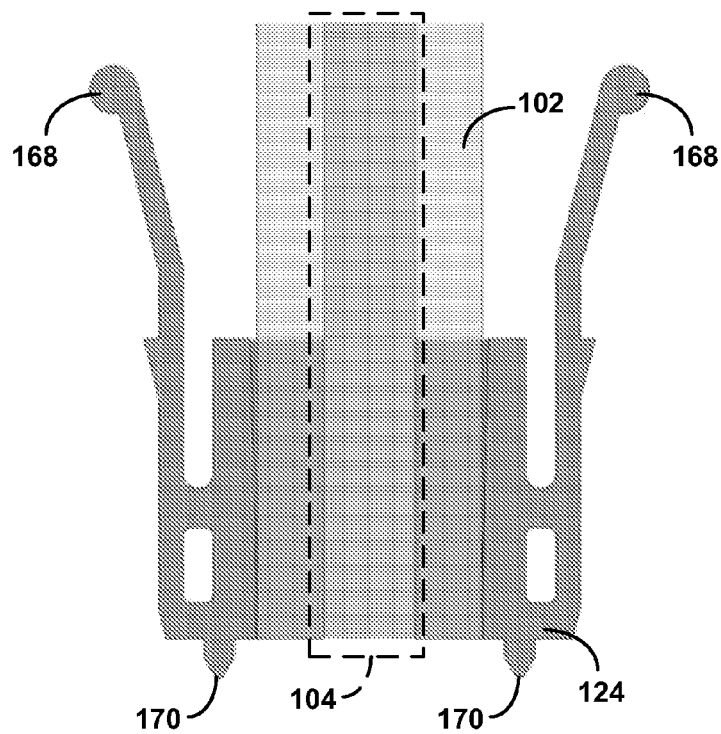
FIG. 15 illustrates a cross sectional view of a male optical connector illustrated in FIG. 14.

FIG. 14 illustrates an expanded view of the male optical connector 124 and the optical waveguide 102 taken from line 166 of FIG. 13. FIG. 15 illustrates a cross sectional view of the male optical connector 124 and the optical waveguide 102 taken along line B-B of FIG. 14. The male optical connector 124 can be affixed to the optical waveguide 102 at an end of the optical waveguide 102 that is distal to the TIR edge 162 of the optical waveguide 102. The N number of optical lanes 104 in the optical waveguide 102 can be provided through an opening in the male optical connector 124. The male optical connector 124 can be implemented, for example, as an in-line, low-cost optical connector, which can be referred to as an optical waveguide-to-optical waveguide optical connector.

The male optical connector 124 can include clips 168 that extend from a main body of the male optical connector 124. The clips 168 can extend in opposing directions and can be flexible. Moreover, rigid aligning pins 170 can extend from the main body of the male optical connector 124 that can mechanically couple and align the male optical connector 124 to a corresponding female connector.

Figure 16:
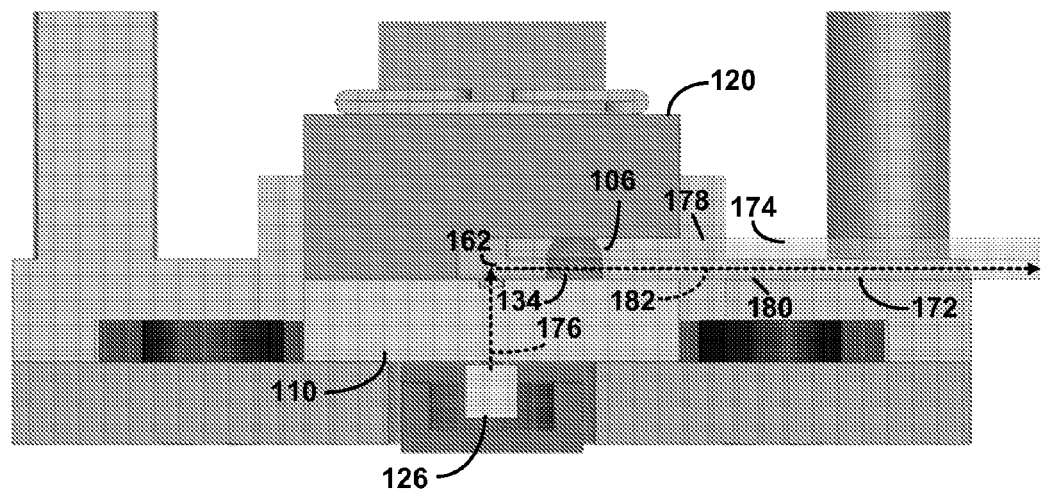
FIG. 16 illustrates a cross sectional view of the optical engine illustrated in FIG. 13.

FIG. 16 illustrates a cross sectional view of the fully assembled optical engine 100 taken along line C-C of FIG. 13. In this view, it can be observed that the optical waveguide 102 includes the polymer waveguide 172 laminated to the stiffener 174. Moreover, the alignment holes 106 can receive the first set of alignment pins 134 of the glass slab 110. The spacer 120 can contact a top of the first set of alignment pins 134 of the glass slab 110. Moreover, the spacer 120 can apply a force to the optical waveguide 102 to reduce and/or eliminate relative movement between the optical waveguide 102 and the glass slab 110.

The optical transmitter 126 can transmit an optical light beam in a direction perpendicular to top and bottom surfaces 178 and 180 of the optical waveguide 102. In the present example, the optical light beam can be depicted as arrow 176. The TIR edge 162 of the optical waveguide 102 can cause the optical light beam to change direction by an angle of about 90° such that the optical light beam can be transmitted in a direction parallel to the top and bottom surfaces 178 and 180 of the optical waveguide 102 and toward the male optical connector 124. The bent optical light beam can be represented by arrow 182.

Figure 17:
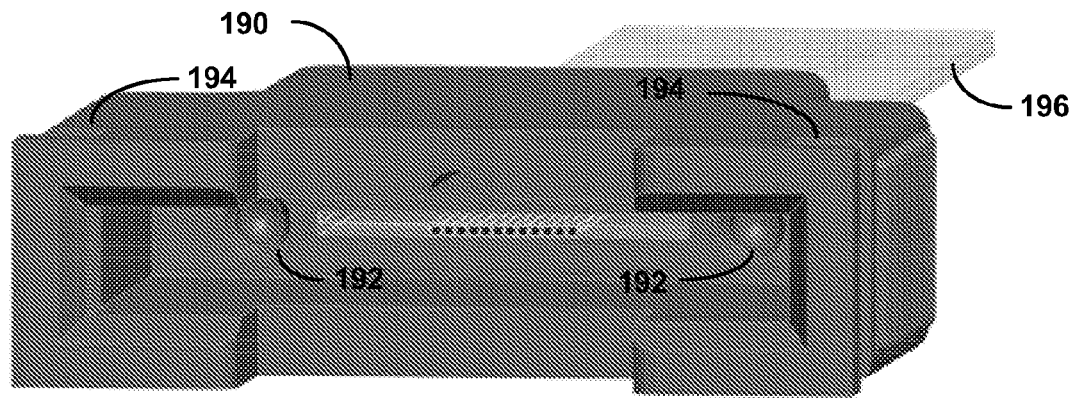
FIG. 17 illustrates an example of a female optical connector that could be employed to implement the optical engine illustrated in FIG. 1.
Figure 18:
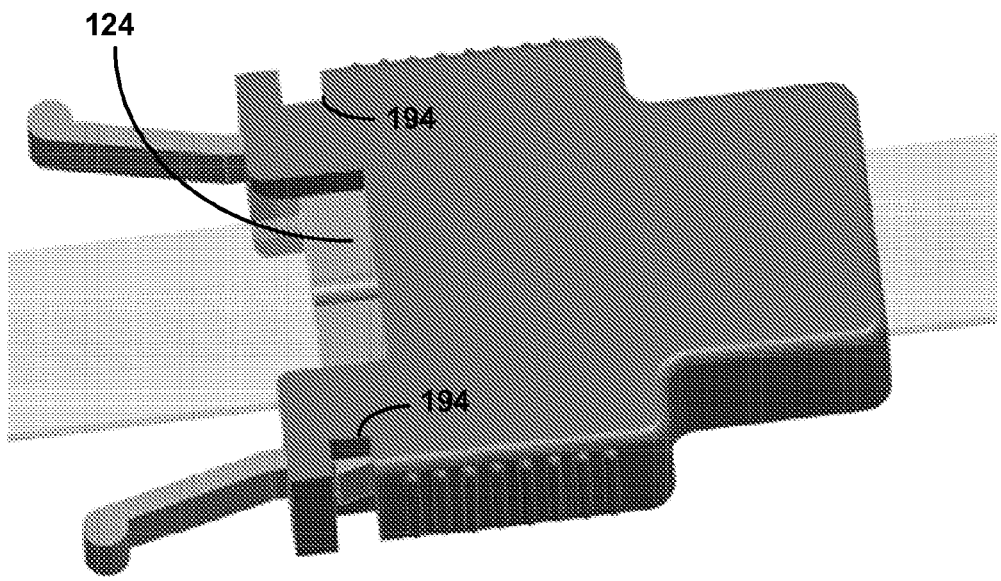
FIG. 18 illustrates an example the female optical connector illustrated in FIG. 17 and the male optical connector illustrated in FIG. 15 in a connected condition.

FIG. 17 illustrates an example of a female optical connector 190 that could be employed in place of the male optical connector 124. Alternatively, the female optical connector 190 can be mechanically coupled to the male optical connector 124. The female connector can include aligning holes 192 that can receive the aligning pins of the male optical connector 124. Additionally, the female optical connector 190 can include grooves 194 to receive the clips of the male optical connector 124. The female optical connector 190 can be affixed to another optical waveguide 192. FIG. 18 illustrates an example of the female optical connector 190 mechanically coupled and aligned with the male optical connector 124. In this manner, the optical light beam can be transmitted from the optical transmitter 126, via the optical waveguide 102 to the other optical waveguide 196 passing through the male and female optical connectors. In some examples, the other optical waveguide 192 can be optically coupled with an optical receiver, such that the optical light beam can be transmitted from the optical transmitter 126 to the optical receiver.

By employment of the optical engine 100, a low-profile, low-cost, high-bandwidth optical connection can be achieved. Moreover, the first set of alignment pins 134 of the glass slab 110 and the corresponding alignment holes 106 of the optical waveguide 102 reduce and/or eliminate the need for adjustment to the optical transmitter 126 upon assembly of the optical engine 100.

Figure 19:
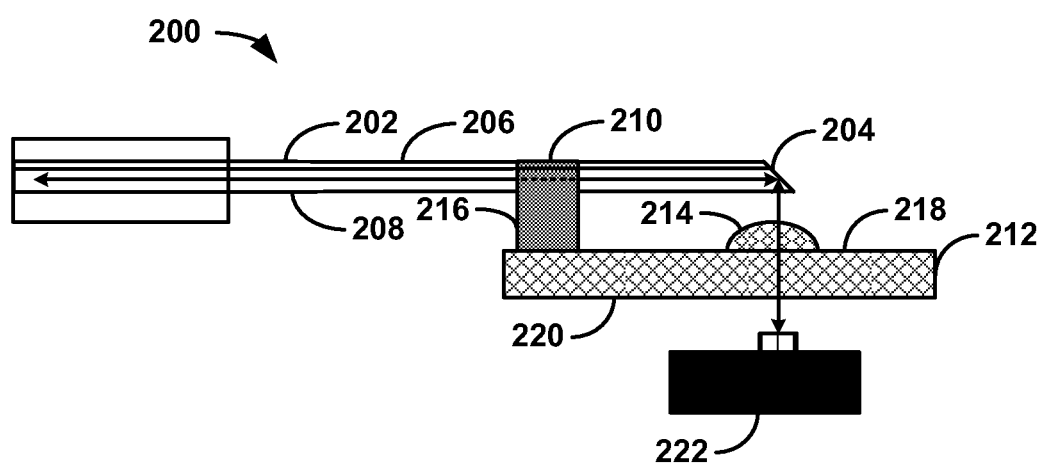
FIG. 19 illustrates another example of an optical engine that could be employed to implement the optical engine illustrated in FIG. 1.

FIG. 19 illustrates a cross sectional view of an optical engine 200. The optical engine comprising an optical waveguide 202. The optical waveguide 202 can comprise a TIR edge 204 to change direction of an optical light beam to an angle parallel to a top surface 206 and bottom surface 208 of the optical waveguide 202. The optical waveguide 202 can comprise a plurality of aligning holes 210 extending from the top surface 206 to the bottom surface 208 of the optical waveguide 202. The optical engine 200 can also comprise a substantially transparent slab 212 underlying the optical waveguide 202. The slab 212 can comprise a micro lens 214 to collimate the optical light beam. The slab 212 can also comprise a plurality of aligning pins 216 extending perpendicular to a top surface 218 and bottom surface 220 of the slab 212. Each of the plurality of aligning pins 216 can extend through a respective one of the plurality of aligning holes 210, such that the optical waveguide 202 can be positioned such that the TIR edge 204 of the optical waveguide 202 overlays the micro lens 214. The optical engine 200 can also comprise an optical element 222 (e.g., a laser array or a photodetector array) to receive or provide the optical light beam.

Figure 20:
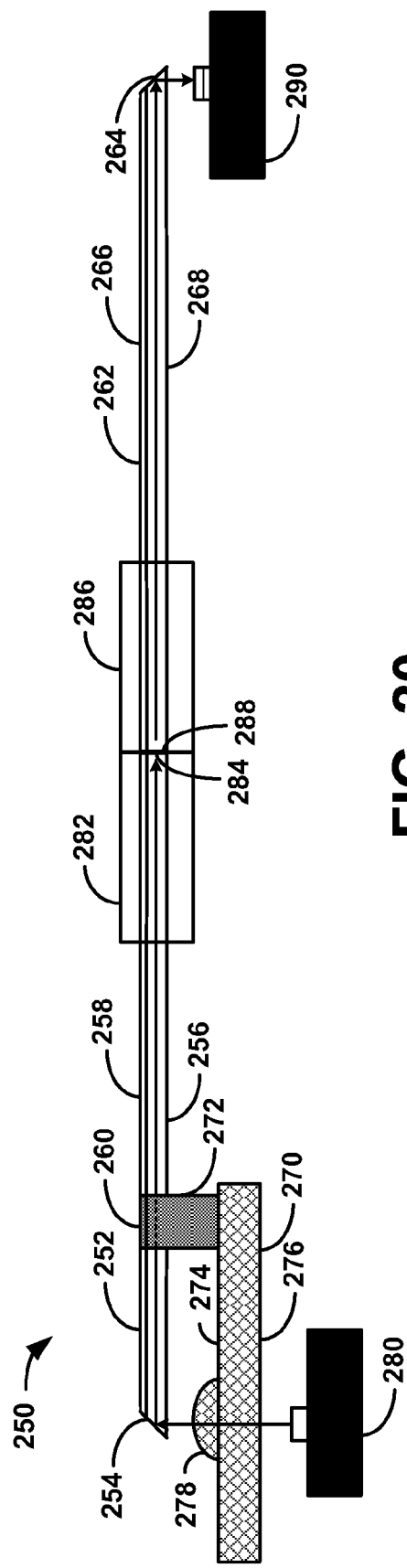
FIG. 20 illustrates a system for transmitting and receiving an optical light beam carrying communication signals that can employ the optical engine illustrated in FIG. 1.

FIG. 20 illustrates an example of an optical system 250. The system 250 can comprise a given optical waveguide 252 comprising a given TIR edge 254 to change direction of an optical light beam to an angle parallel to a top surface 256 and a bottom surface 258 of the given optical waveguide 252. The given optical waveguide 252 can comprise a plurality of aligning holes 260 extending from the top surface 256 to the bottom surface 258 of the given optical waveguide 252. The system 250 can comprise another optical waveguide 262 comprising another TIR edge 264 to change direction of the optical light beam to an angle substantially perpendicular to a top surface 266 and a bottom surface 268 of the another optical waveguide 262. The system 250 can also comprise a given substantially transparent slab 270 underlying the given optical waveguide 252. The substantially transparent slab 270 can comprise a plurality of aligning pins 272 extending perpendicular to a top surface 274 and a bottom surface 276 of the substantially transparent slab 270. Each of the plurality of aligning pins 272 to extend through a respective one of the plurality of aligning holes 260 of the given optical waveguide 256, such that the given optical waveguide 252 is positioned such that the given TIR edge 254 of the given optical waveguide 252 overlays a micro lens 278 of the given substantially transparent slab 270. The system 250 can also comprise an optical transmitter 280 adhered to the bottom 276 of the given substantially transparent slab 270 to provide the optical light beam to the given TIR edge 254 of the given optical waveguide 252. The system 250 can further comprise a given optical connector 282 mechanically fastened to an end 284 of the given optical waveguide 252 distal to the given TIR edge 254 of the given optical waveguide 252. The system 250 can yet further comprise another optical connector 286 that can be coupled to the given optical connector 282 and mechanically fastened to an end 288 of the another optical waveguide 262 distal to the another TIR edge 264 of the another optical waveguide 262. The given and the another optical waveguides 252 and 262 can be in optical communication. Yet further the system 250 can comprise an optical receiver 290 to receive the optical light beam transmitted by the optical transmitter 280.

Where the disclosure or claims recite "a," "an," "a first," or "another" element, or the equivalent thereof, it should be interpreted to include one or more than one such element, neither requiring nor excluding two or more such elements. Furthermore, what have been described above are examples. It is, of course, not possible to describe every conceivable combination of components or methods, but one of ordinary skill in the art will recognize that many further combinations and permutations are possible. Accordingly, the present disclosure is intended to embrace all such alterations, modifications, and variations that fall within the scope of this application, including the appended claims.

What is claimed is:

1. An optical engine comprising:
   an optical waveguide comprising:
      a total internal reflection (TIR) edge to change direction of an optical light beam to an angle parallel to a top surface and a bottom surface of the optical waveguide; and
      a plurality of aligning holes extending from the top surface to the bottom surface of the optical waveguide;
   a substantially transparent slab underlying the optical waveguide, the slab comprising:
      a micro lens to collimate the optical light beam; and
      a plurality of aligning pins extending perpendicular to a top surface and a bottom surface of the slab, each of the plurality of aligning pins to extend through a respective one of the plurality of aligning holes, such that the optical waveguide is positioned such that the TIR edge of the optical waveguide overlays the micro lens;
   an optical element to receive or provide the optical light beam; and
   an optical connector mechanically fastened to an end of the optical waveguide distal to the TIR edge of the optical waveguide.

2. The optical engine of claim 1, wherein the optical element comprises an optical transmitter underlying the slab, the optical transmitter to provide the optical light beam to the micro lens in a direction substantially perpendicular to the top and bottom surfaces of the optical waveguide.

3. The optical engine of claim 1, wherein the slab comprises a glass slab.

4. The optical engine of claim 1, wherein:
   the micro lens comprises an array of micro lenses; and
   the optical transmitter comprises an array of laser diodes, each laser diode of the array of laser diodes is to provide an optical light beam to a respective micro lens of the array of micro lenses.

5. The optical engine of claim 1, wherein the optical element comprises an optical receiver underlying the slab, the optical receiver to receive the optical light beam from the micro lens in a direction substantially perpendicular to the top and bottom surfaces of the optical waveguide.

6. The optical engine of claim 1, wherein the optical element is electrically connected to a printed circuit board, and the printed circuit board comprises an elongated aperture to receive the optical element.

7. The optical engine of claim 6, further comprising a heat spreader comprising:
- a set of opposing clips to extend through the elongated aperture of the PCB; and
- a groove to receive and thermally contact the optical element.

8. The optical engine of claim 7, further comprising a heat sink in thermal communication with the heat spreader, the heat sink comprising:
- a given set of grooves to receive the opposing set of clips of the heat spreader;
- another set of grooves to receive opposing arms of a clip to fasten and position a spacer with the optical waveguide;
- an aperture to enclose the slab on four sides; and
- an optical waveguide groove to receive the optical waveguide.

9. The optical engine of claim 8, wherein the heat sink further comprises a plurality of heat distribution elements to draw heat away from the optical element.

10. The optical engine of claim 1, wherein the optical element is adhered to the slab via solder.

11. The optical engine of claim 1, wherein the optical waveguide comprises:
- a polymer material comprising a plurality of parallel optical lanes to propagate a plurality of optical light beams concurrently; and
- a stiffener material overlying the polymer material, wherein the stiffener material is relatively rigid.

12. A system comprising:
a given optical waveguide comprising:
- a given total internal reflection (TIR) edge to change direction of an optical light beam to an angle parallel to a top surface and a bottom surface of the given optical waveguide; and
- a plurality of aligning holes extending from the top surface to the bottom surface of the given optical waveguide;

another optical waveguide comprising another TIR edge to change direction of the optical light beam to an angle substantially perpendicular to a top surface and a bottom surface of the another optical waveguide;

a given substantially transparent slab underlying the given optical waveguide, the substantially transparent slab comprising a plurality of aligning pins extending perpendicular to a top surface and bottom surface of the substantially transparent slab, each of the plurality of aligning pins to extend through a respective one of the plurality of aligning holes of the given optical waveguide, such that the given optical waveguide is positioned such that the given TIR edge of the given optical waveguide overlays a micro lens of the given substantially transparent slab;

an optical transmitter adhered to the bottom of the given substantially transparent slab to provide the optical light beam to the given TIR edge of the given optical waveguide;

a given optical connector mechanically fastened to an end of the given optical waveguide distal to the given TIR edge of the given optical waveguide;

another optical connector coupled to the given optical connector and mechanically fastened to an end of the another optical waveguide distal to the another TIR edge of the another optical waveguide, wherein the given and the another optical waveguides are in optical communication; and an optical receiver to receive the optical light beam transmitted by the optical transmitter.

13. The optical engine of claim 12, wherein each of the given and the another optical waveguides comprises a plurality of parallel optical lanes to propagate a plurality of optical light beams concurrently.

14. An optical engine comprising:
an optical transmitter mounted on an underside of a glass slab, the optical transmitter comprising an integrated circuit (IC) chip to provide a plurality of optical light beams;

the glass slab comprising:
- a plurality of alignment pins extending perpendicular to a top surface and bottom surface of the glass slab; and
- a micro lens array to collimate the plurality of optical light beams propagated from the optical transmitter;

an optical waveguide comprising:
- a polymer optical waveguide material underlying a relatively rigid stiffener material, the polymer optical waveguide material comprising a plurality of optical lanes;
- a total internal reflection (TIR) edge to change direction of each of the plurality of optical light beams into a respective one of the plurality of optical lanes of the polymer optical waveguide; and
- a plurality of alignment holes extending from the top surface to the bottom surface of the optical waveguide, each of the plurality of alignment holes to receive a respective one of the plurality of alignment pins of the glass slab, such that the optical waveguide is positioned such that the TIR edge of the optical waveguide overlays the micro lens array;

a printed circuit board (PCB) adhered to the underside of the glass slab, the PCB comprising:
an elongated aperture to house the optical transmitter and to receive a heat spreader in thermal contact with the optical transmitter;

a heat sink thermally coupled to the heat spreader and the PCB, the heat sink comprising:
- a plurality of heat distribution elements to draw heat away from the heat spreader and the optical transmitter; and
- an optical waveguide groove to position the optical waveguide; and an optical connector mechanically fastened to an end of the optical waveguide distal to the TIR edge of the optical waveguide, the optical connector to optically couple the optical waveguide to another optical waveguide.

15. An optical engine comprising:
an optical waveguide comprising a total internal reflection (TIR) edge to change direction of an optical light beam to an angle parallel to a top surface and a bottom surface of the optical waveguide;

a substantially transparent slab underlying the optical waveguide, the slab comprising a micro lens to collimate the optical light beam, the TIR edge of the optical waveguide overlaying the micro lens;

an optical element to receive or provide the optical light beam; and an optical connector mechanically fastened to an end of the optical waveguide distal to the TIR edge of the optical waveguide.

16. The optical engine of claim 15, wherein the optical element comprises an optical transmitter underlying the slab, the optical transmitter to provide the optical light beam to the micro lens in a direction substantially perpendicular to the top and bottom surfaces of the optical waveguide.

17. The optical engine of claim 15, wherein the slab comprises a glass slab.

18. The optical engine of claim 15, wherein:
the micro lens comprises an array of micro lenses; and
the optical transmitter comprises an array of laser diodes, each laser diode of the array of laser diodes is to provide an optical light beam to a respective micro lens of the array of micro lenses.

19. The optical engine of claim 15, wherein the optical element comprises an optical receiver underlying the slab, the optical receiver to receive the optical light beam from the micro lens in a direction substantially perpendicular to the top and bottom surfaces of the optical waveguide.

20. The optical engine of claim 15, wherein the optical element is electrically connected to a printed circuit board, and the printed circuit board comprises an elongated aperture to receive the optical element.

* * * * *